(12) United States Patent
Woo et al.

(10) Patent No.: US 10,939,570 B2
(45) Date of Patent: Mar. 2, 2021

(54) DISPLAY AND ELECTRONIC DEVICE INCLUDING WATERPROOF STRUCTURE

(71) Applicant: Samsung Electronics Co., Ltd., Suwon-si (KR)

(72) Inventors: Sunggwan Woo, Suwon-si (KR); Bowon Jung, Suwon-si (KR); Youngman Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 16 days.

(21) Appl. No.: 16/539,459

(22) Filed: Aug. 13, 2019

(65) Prior Publication Data

US 2020/0053897 A1 Feb. 13, 2020

Related U.S. Application Data

(60) Provisional application No. 62/718,073, filed on Aug. 13, 2018.

(30) Foreign Application Priority Data

Aug. 24, 2018 (KR) .......................... 10-2018-0099397

(51) Int. Cl.
*H05K 5/06* (2006.01)
*H04M 1/02* (2006.01)
*H05K 5/00* (2006.01)

(52) U.S. Cl.
CPC .......... *H05K 5/065* (2013.01); *H04M 1/0266* (2013.01); *H04M 1/0277* (2013.01); *H05K 5/0086* (2013.01)

(58) Field of Classification Search
CPC .... H05K 5/0017; H05K 5/065; H05K 5/0086; G06F 1/1601; H04M 1/0277; H04M 1/0266; H04M 1/0268; H04M 1/18
See application file for complete search history.

(56) References Cited

U.S. PATENT DOCUMENTS 9,298,220 B2 * 3/2016 Choi ..................... G06F 1/1626
10,182,134 B2 * 1/2019 Lim ....................... G06F 1/1656
(Continued)

FOREIGN PATENT DOCUMENTS

CN 103095881 A 5/2013
CN 105307435 A 2/2016
(Continued)

OTHER PUBLICATIONS

International Search Report dated Dec. 16, 2019, issued in an International application No. PCT/KR2019/010291.

*Primary Examiner* — Hung S. Bui
*Assistant Examiner* — Sagar Shrestha
(74) *Attorney, Agent, or Firm* — Jefferson IP Law, LLP

(57) ABSTRACT

An electronic device including a waterproof structure is provided. The electronic device includes a housing including a first plate oriented in a first direction, a second plate oriented in a second direction opposite to the first direction, and a side surface member surrounding a space between the first plate and the second plate, and a display panel disposed between the first plate and the second plate. The display panel includes a flat area including an active area configured to emit light toward the first plate, and a connection area extending from at least a partial area of one edge of the flat area and is disposed between the first plate and the second plate, a polarizing plate disposed on the flat area, and a filler member spaced apart from the connection area and disposed on the one edge of the flat area, wherein the one edge of the flat area includes a cut surface bent in a stepped shape in an area on which the filler member is disposed, and a part of the cut surface includes a shape in which a boundary of the display panel coincides with a boundary of the polarizing plate.

20 Claims, 15 Drawing Sheets

(56) References Cited

U.S. PATENT DOCUMENTS

| | | | |
|---|---|---|---|
| 10,509,439 B2* | 12/2019 | Choi | G06F 1/1652 |
| 10,530,912 B2* | 1/2020 | Moon | H04M 1/185 |
| 2014/0080552 A1* | 3/2014 | Yoon | H04B 1/3888 |
| | | | 455/575.8 |
| 2014/0160694 A1* | 6/2014 | Yoon | G02F 1/1303 |
| | | | 361/749 |
| 2014/0233194 A1 | 8/2014 | Hongo et al. | |
| 2016/0062391 A1* | 3/2016 | Choi | H04M 1/0266 |
| | | | 361/679.03 |
| 2016/0234362 A1* | 8/2016 | Moon | H04M 1/185 |
| 2016/0364075 A1* | 12/2016 | Mizuno | G06F 3/044 |
| 2018/0084680 A1* | 3/2018 | Jarvis | H01M 2/1016 |
| 2018/0183912 A1 | 6/2018 | Lim et al. | |
| 2019/0018275 A1* | 1/2019 | Ochi | H04M 1/0266 |

FOREIGN PATENT DOCUMENTS

| | | |
|---|---|---|
| EP | 3509277 A1 | 7/2019 |
| JP | 2009086187 A | 4/2009 |
| KR | 10-2017-0040082 A | 4/2017 |
| KR | 10-2018-0026191 A | 3/2018 |

* cited by examiner

DISPLAY AND ELECTRONIC DEVICE INCLUDING WATERPROOF STRUCTURE

CROSS-REFERENCE TO RELATED APPLICATION(S)

This application is based on and claims priority under 35 U.S.C. § 119(e) of a U.S. Provisional application Ser. No. 62/718,073, filed on Aug. 13, 2018, in the U.S. Patent and Trademark Office, and under 35 U.S.C. § 119(a) of a Korean patent application number 10-2018-0099397, filed on Aug. 24, 2018, in the Korean Intellectual Property Office, the disclosure of each of which is incorporated by reference herein in its entirety.

BACKGROUND

1. Field

The disclosure relates to a display and an electronic device, which includes a waterproof structure.

2. Description of Related Art

Electronic devices have become slimmer according to demands of users and have developed in ways such that the bezel size is reduced. In order to meet a demand for waterproof functionality of electronic devices in everyday life as well as for use in activities such as water sports, electronic devices may exhibit waterproof performance.

In relation to a waterproofing method, an electronic device according to an embodiment may have waterproof tape attached between a window and internal instruments of the electronic device. In order to maintain the waterproof performance of a waterproof member, such as waterproof tape, the waterproof member may be disposed in consideration of the arrangement relations with the other components in the electronic device to prevent the separation of the waterproof member after being attached.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a waterproof structure.

In accordance with an aspect of the disclosure, an electronic device is provided. The electronic device includes a waterproof member disposed therein for a waterproof function. The waterproof member may be interposed between a window and a housing and may implement a waterproof function of sealing an inner space of the electronic device when the window and the housing are coupled to each other.

In order to exhibit waterproof performance, waterproof tape may be required to have a predetermined width or greater and may have a problem that a black matrix (BM) area increases as much as the width of the waterproof tape.

Another aspect of the disclosure is to provide a display and an electronic device, which can ensure waterproof performance without increasing a BM area.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate oriented in a first direction, a second plate oriented in a second direction opposite to the first direction, and a side surface member surrounding a space between the first plate and the second plate, a display panel including an active area configured to emit light toward the first plate and a connection area extending from at least a partial area of one edge of the active area, a polarizing plate disposed on the active area, and a protective layer disposed on the connection area, wherein a boundary of a remaining area of the one edge coincides with a boundary of an edge of the polarizing plate.

In accordance with another aspect of the disclosure, a display device is provided. The display device includes a display panel including an active area configured to emit light and a connection area extending from at least a partial area of one edge of the active area, a display drive circuit disposed in the connection area, a polarizing plate disposed on the active area, and a protective layer disposed on the connection area, wherein a boundary of a remaining area of the one edge coincides with a boundary of an edge of the polarizing plate.

In an electronic device according to various embodiments, the occurrence of a reverse stepped portion between a display panel and a polarizing plate is prevented without increasing an area on which a waterproof member is disposed, so that waterproof performance is improved.

According to various embodiments, an electronic device can have a reduced BM area of a display and thus implement a wider display screen.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
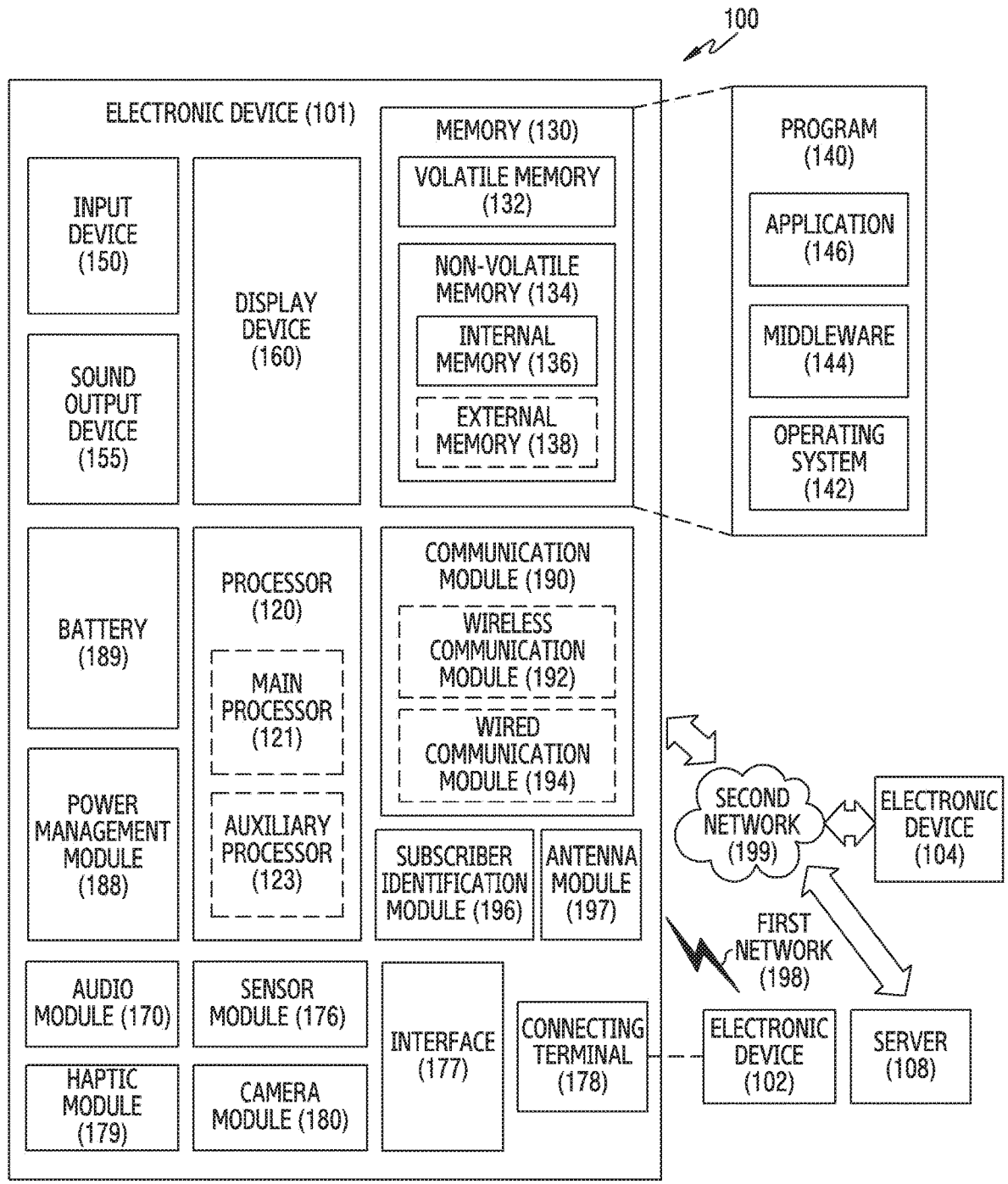
FIG. 1 is a block diagram of an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
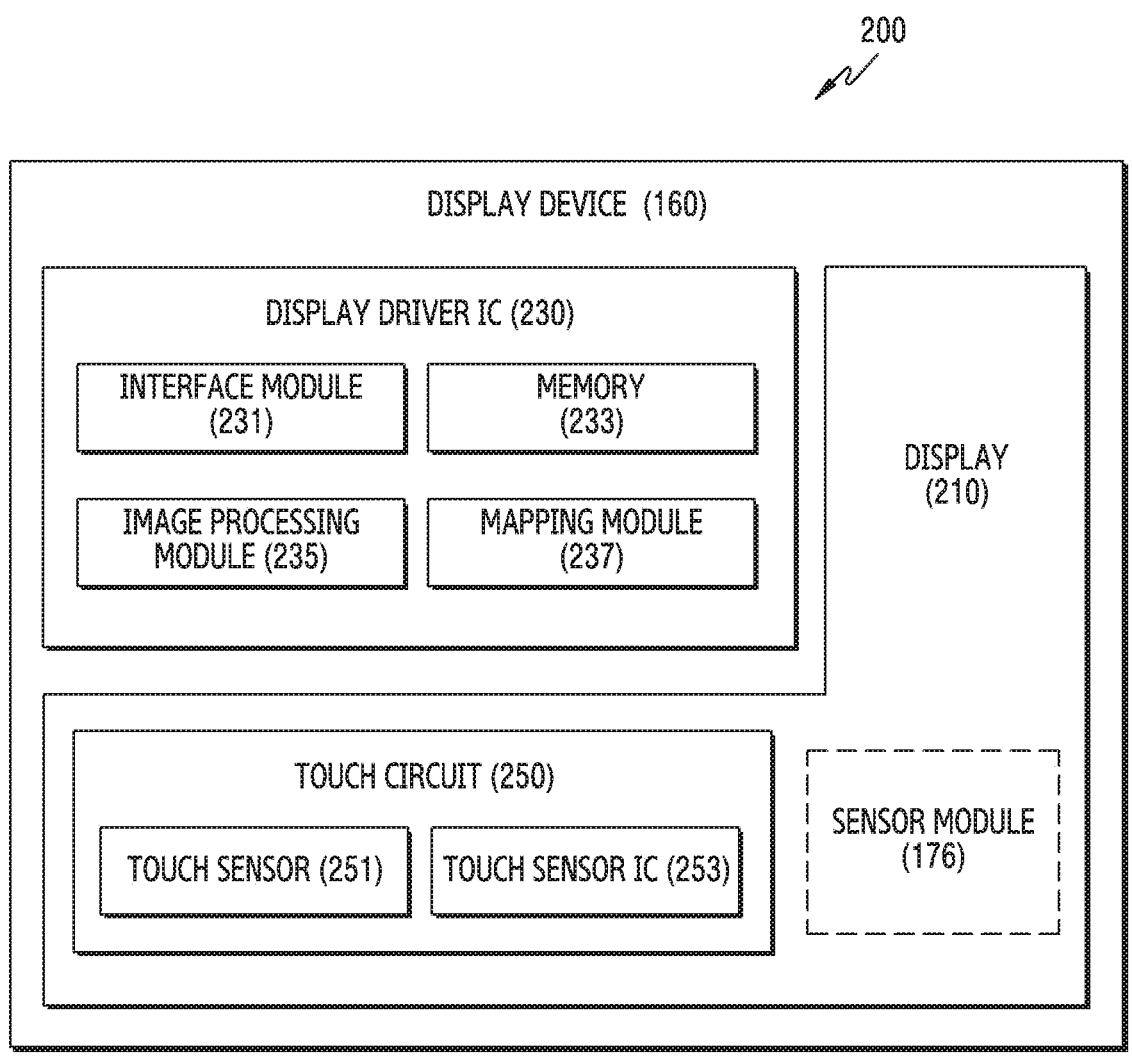
FIG. 2 is a block diagram of a display device according to an embodiment of the disclosure.

FIG. 2 is a block diagram 200 illustrating the display device 160 according to an embodiment of the disclosure.

Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry or input device 150 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry/input device 150)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3A:
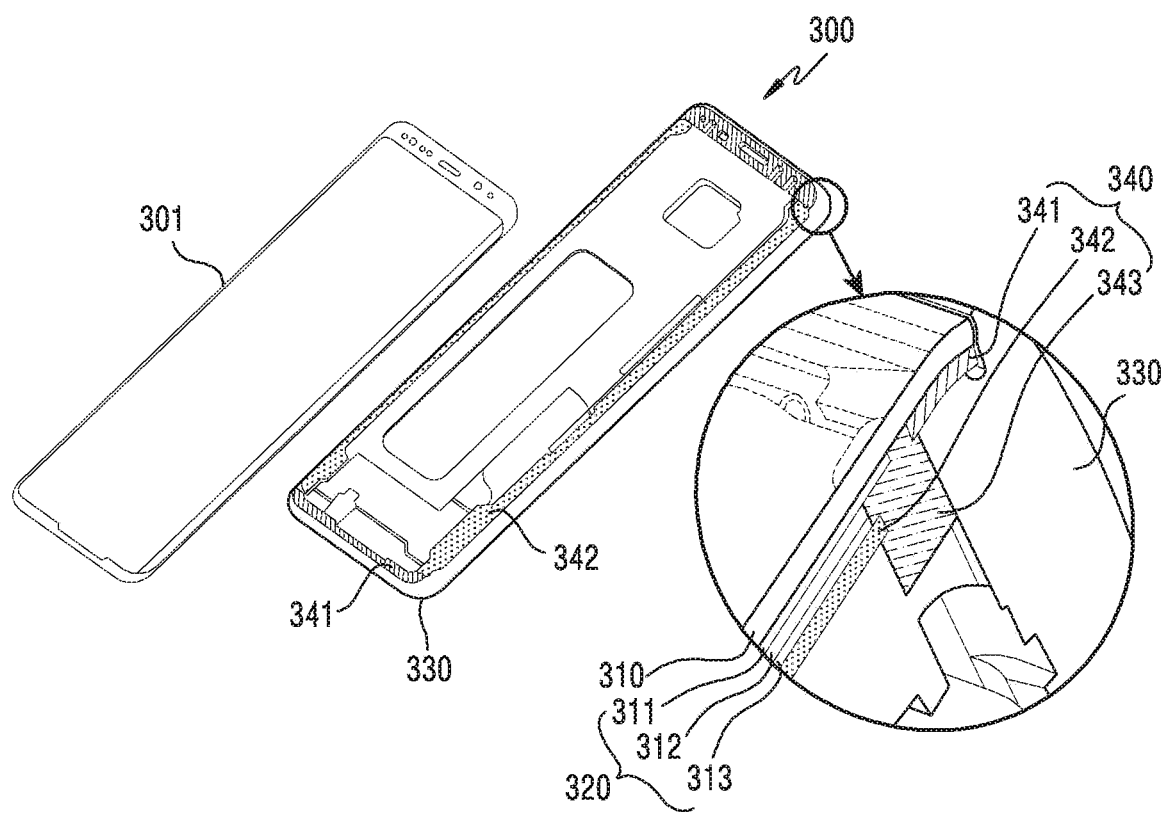
FIG. 3A is a perspective view illustrating a waterproof structure of an electronic device according to an embodiment of the disclosure.
Figure 3B:
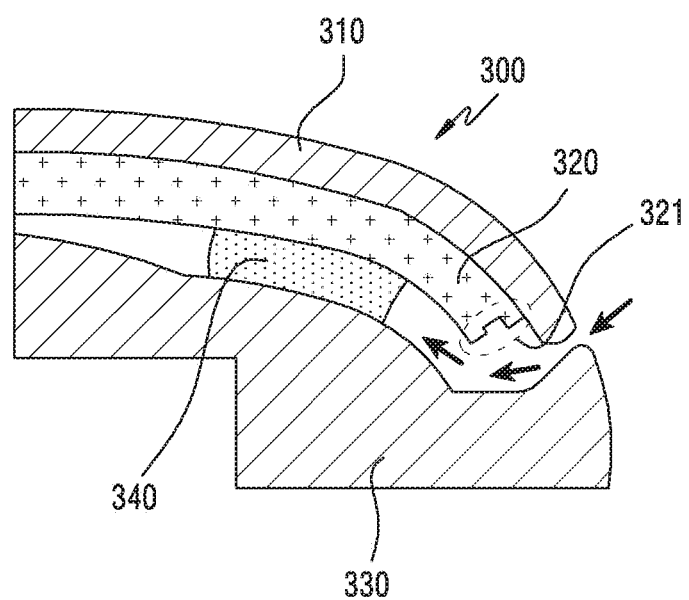
FIG. 3B is a sectional view illustrating a waterproof structure of an electronic device according to an embodiment of the disclosure.

FIG. 3A is a perspective view illustrating a waterproof structure of an electronic device according to an embodiment of the disclosure, and FIG. 3B is a sectional view illustrating a waterproof structure of an electronic device according to an embodiment of the disclosure.

Referring to FIG. 3A, an electronic device 300 may include a display 301 and a side surface member 330. According to various embodiments, the electronic device 300 may not include a part of the elements illustrated in FIG. 3A and may additionally include an element not illustrated in FIG. 3A.

According to an embodiment, the display 301 may include a transparent plate 310 and a display module 320. The transparent plate 310 may allow light emitted from the display module 320, to pass therethrough. The transparent plate 310 may be formed by using at least one material among glass or a polymer material, such as polycarbonate (PC), polymethyl methacrylate (PMMA), polyimide (PE), polyethylene terephthalate (PET), and polypropylene terephthalate (PPT), which are high molecular substances. According to an embodiment, the transparent plate 310 may include a multilayer structure made of various materials.

According to an embodiment, the display module 320 may include multiple layers including a thin-film transistor layer, an organic light emitting layer, and the like. The display module 320 may output various contents by a plurality of pixels included in a display panel 313.

According to an embodiment, the display module 320 may include an adhesive member 311, a polarizing layer (or polarizing plate, polarizing film) 312, and the display panel 313. The adhesive member 311 may be used to attach the transparent plate 310 and the display module 320 to each other or attach layers included in each of the transparent plate and the display module, to each other. The adhesive member 311 may include a double-sided adhesive film, a pressure-sensitive adhesive, an optical clear adhesive (OCA), or an optical clear resin (OCR).

According to an embodiment, the polarizing layer 312 may be attached to the transparent plate 310 by the adhesive member 311. The polarizing layer 312 may prevent reflection of external light to improve panel visibility at a place with strong external light, such as an outdoor place. The polarizing layer 312 may be made of a polyethylene terephthalate (PET) film or a tri-acetyl cellulose (TAC) film.

The display panel 313 may include: a scan line and a data line; a light emitting element (e.g., OLED) configured to generate light on the basis of signals supplied from the scan line and the data line; a substrate (e.g., low temperature poly silicon (LTPS) substrate), on which the light emitting element is disposed; and a thin film encapsulation (TFE) film configured to protect the light emitting element.

According to an embodiment, the side surface member 330 may be coated with a first waterproof member 341, which is disposed on each of an upper portion and a lower portion of the side surface member and in contact with the transparent plate 310. A second waterproof member 342 may be applied to a longitudinal side surface of the side surface member 330 and be in contact with a rear surface of the display module 320. According to various embodiments, the first and second waterproof members 341 and 342 may include at least one of tape, an adhesive, a waterproof dispenser, silicone, a waterproof rubber, and urethane.

According to an embodiment, a filler member 343 is a resin disposed at a position where there is a difference in height between the first waterproof member 341 and the second waterproof member 342, and may be a cured-in-placed gasket (CIPG).

According to various embodiments, the first waterproof member 341, the second waterproof member 342, and the filler member 343 may be in close contact with edges of the display 301 including the transparent plate 310 and thus form a sealed space for waterproofing.

FIG. 3B is a sectional view illustrating a waterproof structure of an electronic device according to an embodiment of the disclosure.

Referring to FIG. 3B, in the electronic device 300, a waterproof member 340 is disposed between one surface of the side surface member 330 and the transparent plate 310 or between one surface of the side surface member and the display module 320 to ensure waterproof performance. When the waterproof member 340 is disposed between the transparent plate 310 and the side surface member 330, a bezel of the electronic device 300 may be thick as much as a width of the waterproof member 340. In view of the electronic device 300 having a thin bezel, the waterproof member 340 may be disposed between the display module 320 and one surface of the side surface member 330.

According to an embodiment, when the waterproof member 340 is disposed on a curved area, the display module 320 and the waterproof member 340 may be separated from a boundary surface, at which the display module and the waterproof member are in contact with each other, by a repulsive force, of multiple layers included in the display module 320, for returning the multiple layers to an original state thereof. When the waterproof member 340 moves to the inside from the curved area and is then disposed on a flat area, the display module 320 and the waterproof member 340 may be prevented from being separated from a boundary surface, at which the display module and the waterproof member are in contact with each other. Therefore, an adhesive strength between the waterproof member 340 and the display module 320 may be maintained, so that the waterproof performance of the electronic device 300 can be improved. Moisture may be introduced up to an area where the waterproof member 340 exists, through a space between the transparent plate 310 and the side surface member 330. Even when a reverse stepped portion 321 formed by multiple layers of the display module 320 is exposed to a moisture migration path (arrow path), there is no problem to achieve a waterproofing function. However, when a reverse stepped portion is formed in the area where the filler member 343 exists, it may be difficult to fill the reverse stepped portion with the filler member 343. According to various embodiments, a protective layer may be applied to remove a reverse stepped portion disposed in a chip on panel (COP) bending area of the display module 320, in which the filler member 343 exists.

Figure 4A:
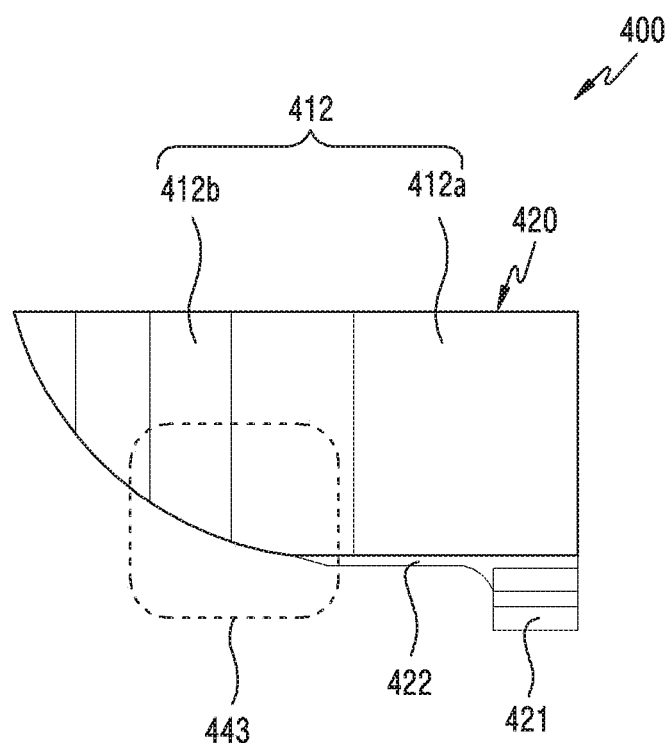
FIG. 4A is a diagram illustrating an area in which a reverse stepped portion in a display module occurs, according to an embodiment of the disclosure.

FIG. 4A is a diagram illustrating an area in which a reverse stepped portion in a display module occurs, according to an embodiment of the disclosure.

Figure 4B:
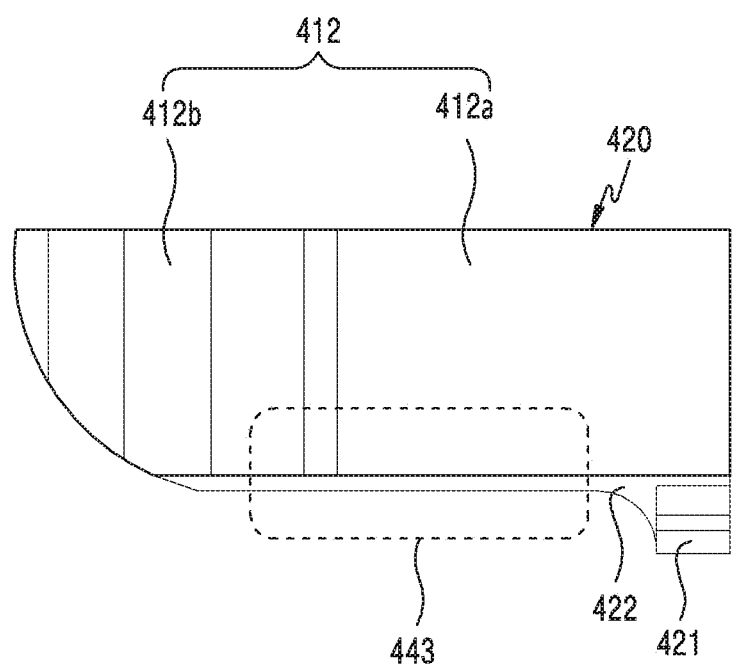
FIG. 4B is a diagram illustrating an area in which a reverse stepped portion in a display module occurs, according to an embodiment of the disclosure.

FIG. 4B is a diagram illustrating an area in which a reverse stepped portion in a display module occurs, according to an embodiment of the disclosure.

Referring to FIGS. 4A and 4B, a display panel 420, of an electronic device 400, may include a polarizing plate 412 and a reverse stepped portion 422 formed by a plurality of layers included in the display panel 420, and a protective layer 421 may be disposed in an area adjacent to the polarizing plate 412.

Referring to FIG. 4A, an area 443 where a filler member is disposed, may be positioned in a curved area 412b. According to an embodiment, the reverse stepped portion 422 may be disposed within a sealed area of an electronic device, and thus can prevent moisture from being introduced therethrough. According to various embodiments, when the area 443 where the filler member is disposed is positioned in a curved area, an adhesive force of the filler member may decrease.

Referring to FIG. 4B, the area 443 where the filler member is disposed may be positioned in a flat area 412a. According to various embodiments, the reverse stepped portion 422 may be disposed in an area outward as well as inward from the area 443 where the filler member is disposed. According to various embodiments, the reverse stepped portion 422 of the display panel 420 may be exposed to a moisture path.

Figure 5A:
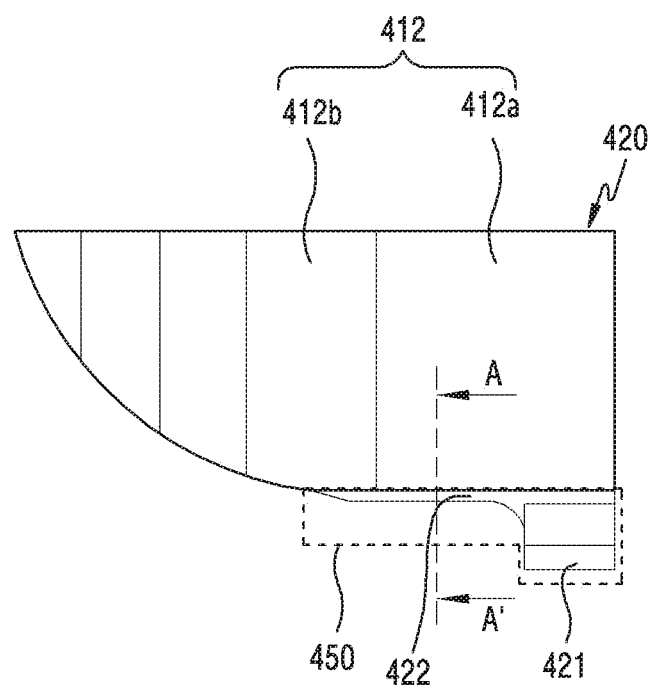
FIG. 5A is a diagram illustrating a display device including a polarizing plate and a protective layer according to an embodiment of the disclosure.

FIG. 5A is a diagram illustrating a display device including a polarizing plate and a protective layer according to an embodiment of the disclosure.

Figure 5B:
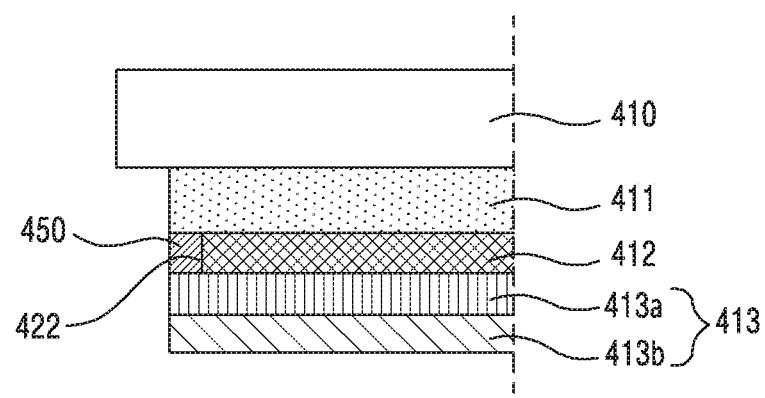
FIG. 5B is a diagram illustrating a display device including a polarizing plate and a protective layer according to an embodiment of the disclosure.

FIG. 5B is a diagram illustrating a display device including a polarizing plate and a protective layer according to an embodiment of the disclosure.

Referring to FIG. 5A, in the display panel 420, the protective layer 421 may be enlarged to remove the reverse stepped portion 422. An additional protective layer 450 may be applied widely in order to secure a predetermined thickness. When the additional protective layer 450 is applied, the reverse stepped portion 422 between the display panel 420 and the polarizing plate may be filled. Accordingly, moisture can be prevented from being introduced through the reverse stepped portion 422.

Referring to FIG. 5B, an electronic device 400 may include a transparent plate 410, an adhesive member 411, a polarizing plate (or polarizing layer) 412, and a display panel 413.

The transparent plate 410 and the polarizing layer 412 may be attached to each other by the adhesive member 411, and the adhesive member 411 may be an optical adhesive member (OCA). An adhesive member may also be interposed between the polarizing layer 412 and a plurality of layers 413a and 413b included in the display panel 413.

By tolerances of the polarizing layer 412 and the display panel 413, a reverse stepped portion 422 may be formed between the polarizing layer 412 and the display panel 413. The reverse stepped portion 422 may be filled with a protective layer 450, e.g., the additional protective layer.

Figure 6A:
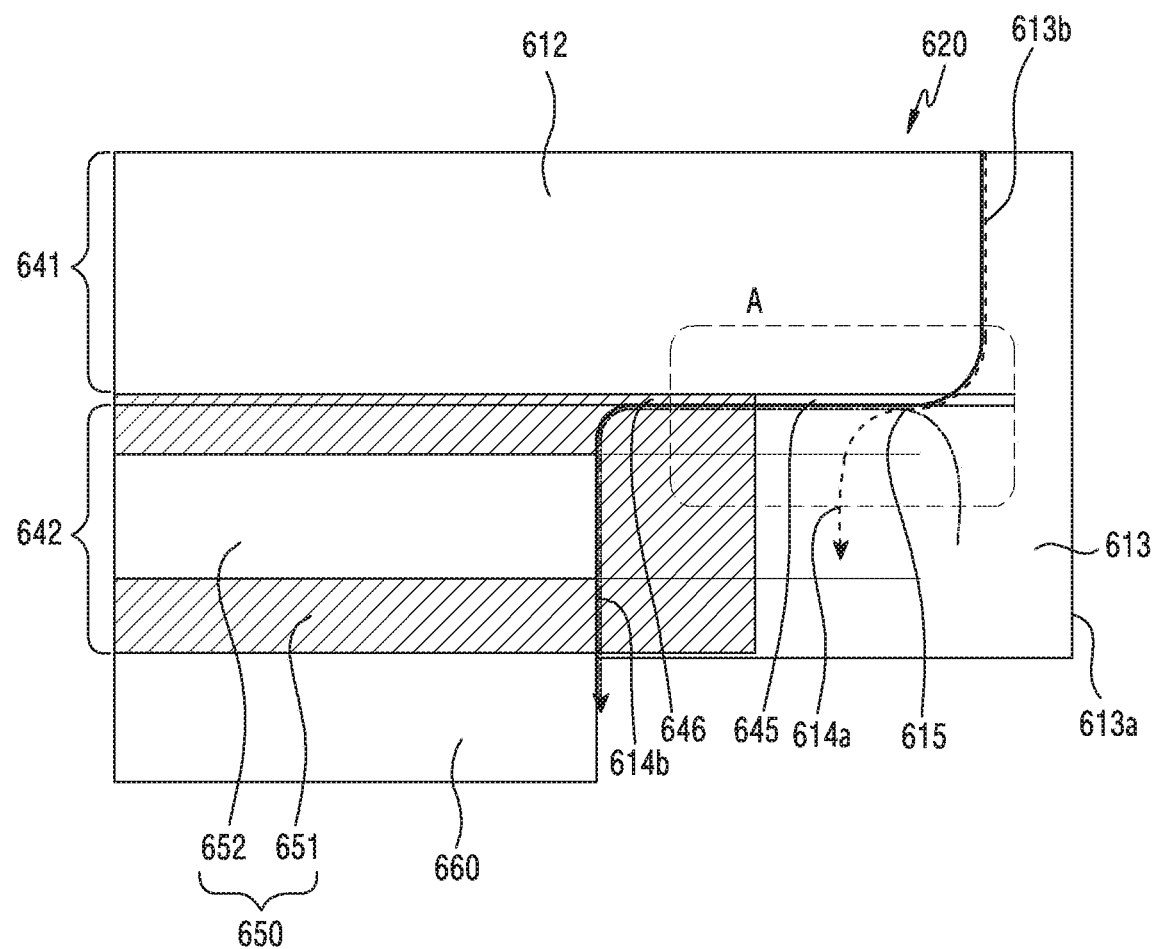
FIG. 6A is a diagram illustrating a cut path of a display module according to an embodiment of the disclosure.

FIG. 6A is a diagram illustrating a cut path of a display module according to an embodiment of the disclosure.

Figure 6B:
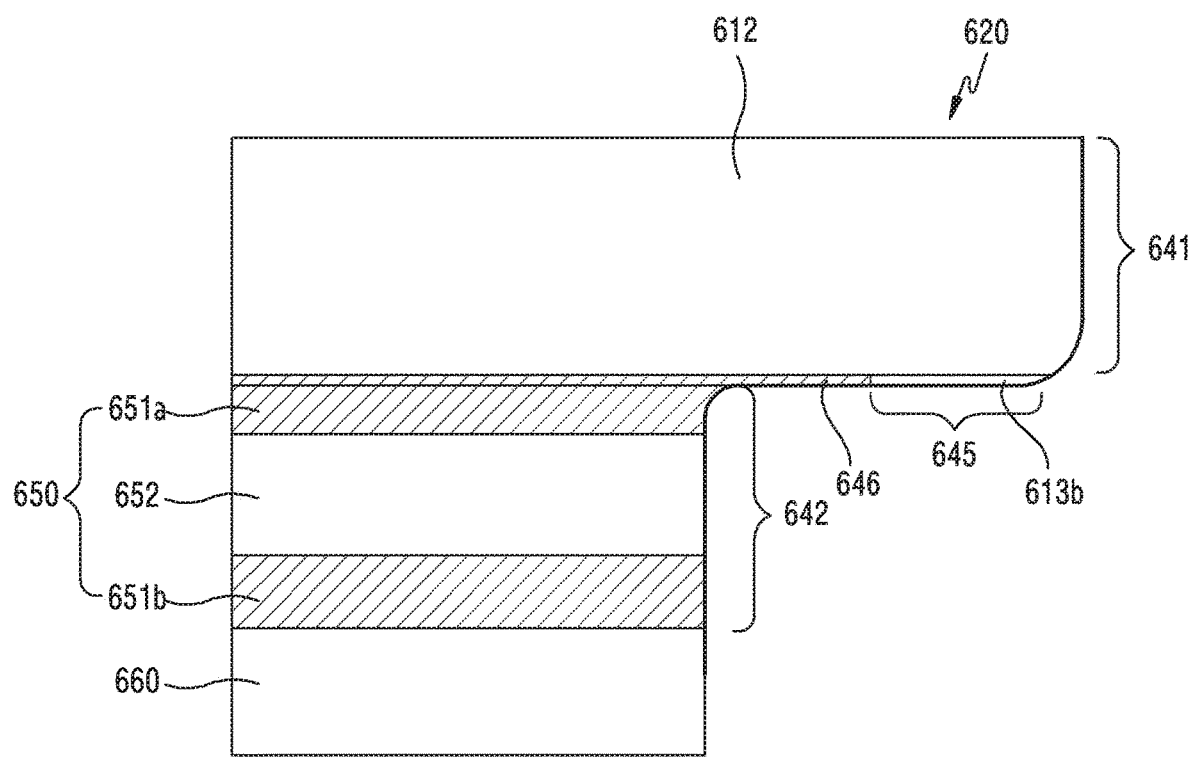
FIG. 6B is a diagram illustrating a cut shape of a display module according to an embodiment of the disclosure.

FIG. 6B is a diagram illustrating a shape of the display module, which has been cut, according to an embodiment of the disclosure.

Referring to FIG. 6A, an operation of cutting a display module 620 by a laser in order to remove a reverse stepped portion of the display module 620 is illustrated.

The display module 620 may include a polarizing layer 612, a display panel 613, a protective layer 650, and a flexible printed circuit board 660.

According to an embodiment, in a partial area of the display module 620, the polarizing layer 612 may be stacked, and the partial area may include the polarizing layer 612 and the protective layer 650, which is disposed along a part of an edge of the polarizing layer 612.

According to an embodiment, the polarizing layer 612 may prevent reflection of external light to improve panel visibility at a place with strong external light, such as an outdoor place. The polarizing layer 612 may be made of a polyethylene terephthalate (PET) film or a tri-acetyl cellulose (TAC) film.

According to an embodiment, the display module 620 may include the display panel, and the display panel may be a flexible display panel. The display panel may include: a scan line and a data line; a light emitting element (e.g., OLED) configured to generate light on the basis of signals supplied from the scan line and the data line; a substrate (e.g., low temperature poly silicon (LTPS) substrate), on which the light emitting element is disposed; and a thin film encapsulation (TFE) film configured to protect the light emitting element.

According to various embodiments, the display module 620 may be based on a polyimide substrate. An area where the protective layer 650 is disposed may include a wire configured to supply power and/or a signal to the display panel. The protective layer 650 may be a bending area protecting layer (bending protection layer (BPL)) configured to prevent breakage of the display module. The protective layer 650 may be disposed on a bending area of the display panel to prevent a breakage of the display panel in an area in which the display module 620 is bent.

According to an embodiment, the protective layer 650 may be applied widely up to an actual application area 651, which is an area other than the bending area 652, in order to maintain a constant thickness of the protective layer 650 in the bending area 652. The reason of the wide application is that, even when a resin, of which the protective layer 650 is made, is applied in a short time and cured, the resin flows freely and thus the thickness of an edge area of the protective layer may fail to be maintained consistently. The actual application area 651 may be applied to be adjacent to an edge of the polarizing layer 612 and may prevent the occurrence of a reverse stepped portion due to an attachment tolerance.

According to various embodiments, the display panel 613 may be cut into substantially a quadrangular panel 613a through a primary laser cutting. By secondary laser cutting, a final display panel 613b including a connection area 642, on which the protective layer 650 is stacked, may be formed from the display panel 613. Conditions of laser cutting for an area 641 of the display panel 613, on which the polarizing layer 612 is stacked, and the connection area 642 of the display panel, on which the protective layer 650 is stacked, may be different from each other. According to an embodiment, the area 641, in which the polarizing layer 612 is stacked on the display panel 613, may be cut along a first path 614a, and the connection area 642, to which the protective layer 650 is applied on the display panel 613, may be cut along a second path 614b. Because the polarizing layer 612 is attached to the display panel 613, or the protective layer 650 is applied to the display panel, the subjects to be cut along the first path 614a and the second path 614b are different. Therefore, conditions of laser cutting for the first path 614a and the second path 614b may be configured to be different from each other.

According to various embodiments, great thermal stress occurs at an intersection point 615 between the first path 614a and the second path 614b, and thus it is difficult to manage a cut surface. Therefore, the intersection point may be positioned to be spaced apart from the bending area 652 of the display panel 613 and be adjacent to a position at which a filler member is disposed.

According to an embodiment, a reverse stepped portion 645 may occur by an attachment tolerance between the polarizing layer 612 and the display panel 613, which are cut along the first path 614a. An area 646 in which the protective layer 650 is disposed on the display panel 613, which is cut along the second path 614b, may fill the reverse stepped portion 645 disposed between the polarizing layer 612 and the display panel 613.

Referring to FIG. 6B, a final shape, for which secondary cutting of the display module 620 has been completed, may be illustrated. According to an embodiment, the display module 620 may include the area 641, in which the polarizing layer stacked on the display panel 613 is positioned, and the connection area 642, which extends from a part of one edge of the stacked polarizing layer 612.

In order to minimize BM of the panel and securely design DDI of the display module 620, the connection area 642 of the display module, including an extended wiring area of the panel may be bent, and a display drive circuit may be disposed on the bent connection area 642. The display module 620 may include the flexible printed circuit board 660 attached to an end portion of the bent connection area 642.

According to an embodiment, the protective layer 650 may be applied widely up to actual application areas 651a and 651b, which are areas other than the bending area 652, in order to maintain a constant thickness of the protective layer 650 in the bending area 652.

According to an embodiment, the protective layer 650 may be applied to maintain a constant thickness in the bending area 652 of the display panel. The protective layer 650 may be applied with a predetermined thickness in the bending area 652 and bent to have a predetermined radius in the bending area 652, and thus the rigidity of the protective layer can be consistently maintained in the bending area 652. The rigidity of the polarizing layer 612 is relatively large and thus may be disposed only in a flat area. When the polarizing layer 612 is disposed in a part of the bending area 652, the bending area has large rigidity and thus has large bend radius, so that a BM can be large. In consideration of an attachment tolerance, the polarizing layer 612 may be positioned more inward than a cut surface of the final display panel 613b of the display panel 613. The polarizing layer 612 and the display panel 613 may include the reverse stepped portion 645.

According to an embodiment, the actual application areas 651a and 651b may be disposed to maintain the thickness of the bending area 652. The first actual application area 651a may be disposed to be adjacent to a part of an edge of the polarizing layer 612 and thus fill the reverse stepped portion 645 in the area 646 in which the protective layer is disposed. The reverse stepped portion 645 exists in an area in which a filler member is disposed, and thus it is difficult to fill the reverse stepped portion with the filler member. Therefore, waterproof performance may be decreased. According to various embodiments, even when the reverse stepped portion 645 is removed by enlarging the area 646 in which the protective layer is disposed, an adhesive force at an interface between the polarizing layer 612 and the protective layer 650 is weak, and thus it may be difficult to block moisture completely.

Figure 7A:
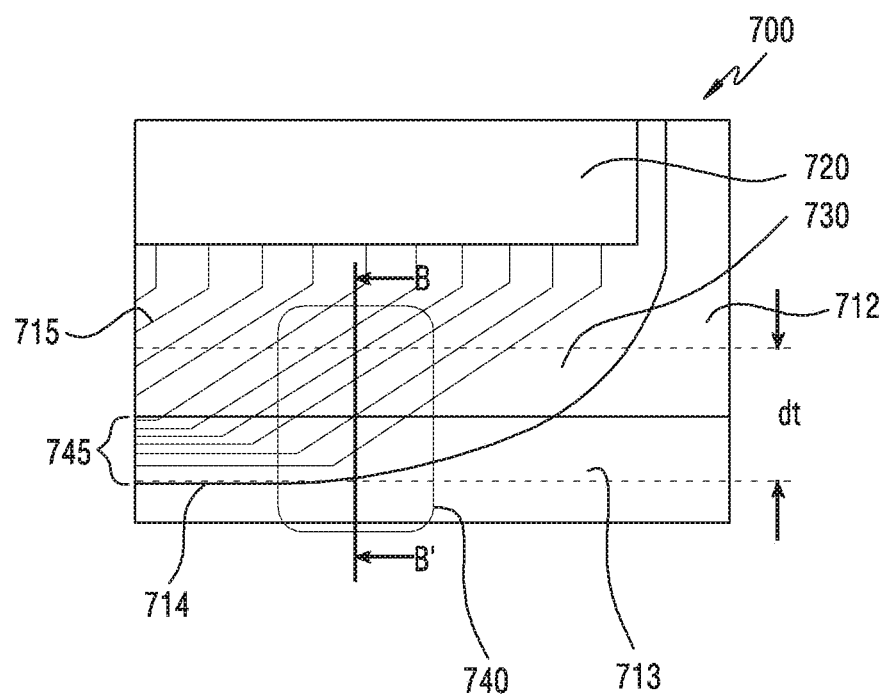
FIG. 7A is a diagram illustrating an arrangement of wires of a display module and a position of a filler member according to an embodiment of the disclosure.

FIG. 7A is a diagram illustrating an arrangement of wires of a display module 700 and a position of a filler member according to an embodiment of the disclosure.

Figure 7B:
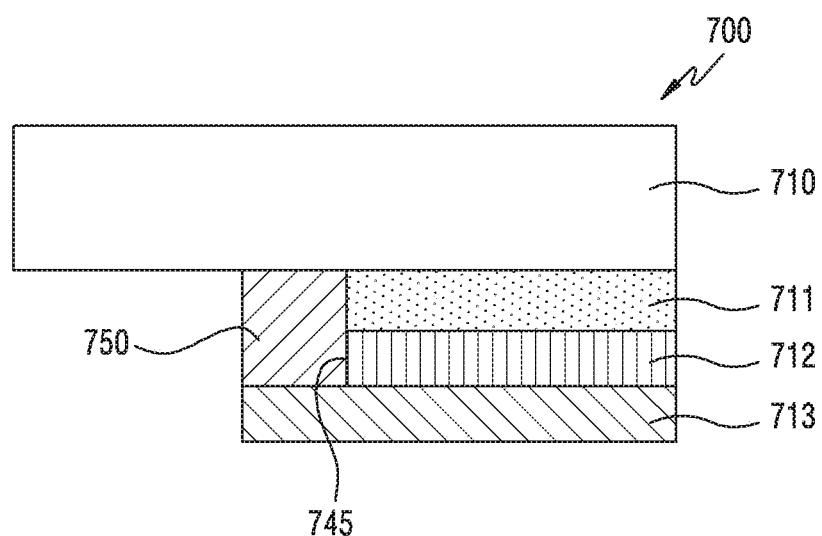
FIG. 7B is a sectional view of the display module illustrated in FIG. 7A according to an embodiment of the disclosure.

FIG. 7B is a sectional view of FIG. 7A according to an embodiment of the disclosure.

Figure 8A:
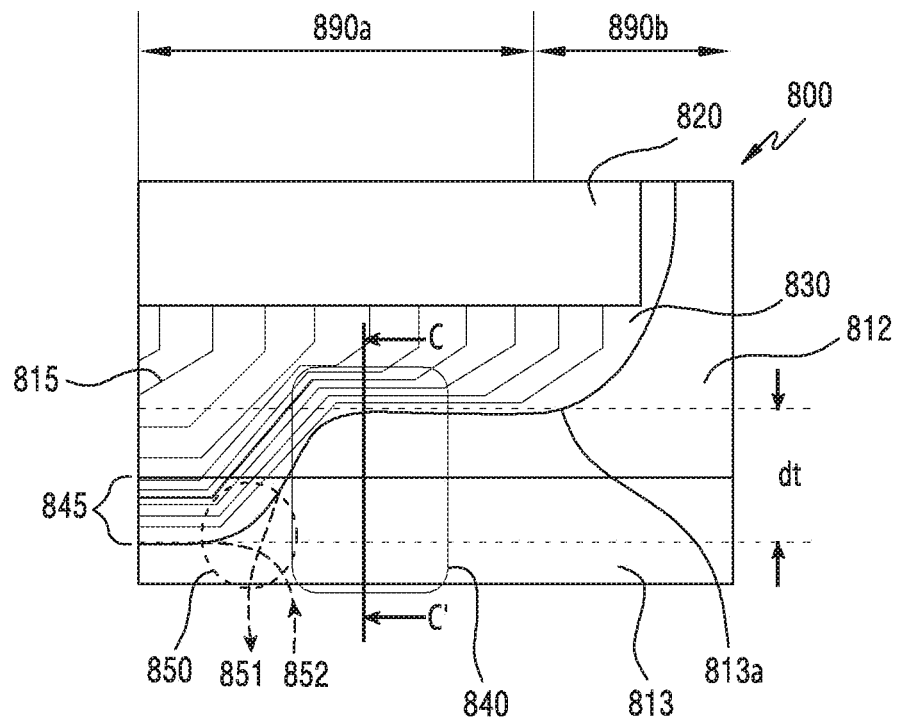
FIG. 8A is a diagram illustrating an arrangement of wires of a display module and a position of a filler member according to an embodiment of the disclosure.

FIG. 8A is a diagram illustrating an arrangement of wires of the display module 800 and a position of a filler member according to an embodiment of the disclosure.

Figure 8B:
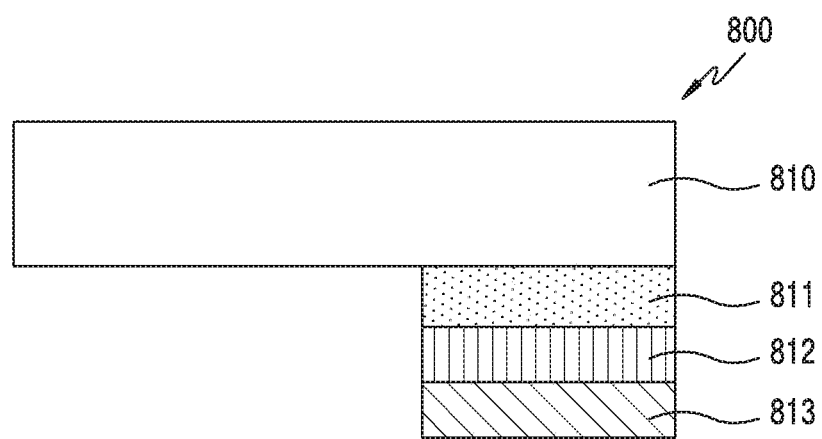
FIG. 8B is a sectional view of the display module illustrated in FIG. 8A according to an embodiment of the disclosure.

FIG. 8B is a sectional view of FIG. 8A according to an embodiment of the disclosure.

Referring to FIGS. 7A and 7B, a case in which a display panel 713 is not cut in a stepped shape and an intersection point is in an area in which a filler member is disposed, is illustrated.

According to various embodiments, the display panel 713 may include an active area 720 and a pad part 730. The active area 720 may be an area including a pixel of the display panel 713 to transmit information to the outside, and the pad part 730 may be an area in which a wire connected to the active area 720 is disposed. The transparent plate 710 and the polarizing plate 712 may be attached to each other by the adhesive member 711, and the adhesive member 711 may be an optical adhesive member (OCA).

According to another embodiment, cutting may be performed up to a bending area by performing the cutting in an area in which a polarizing plate 712 is not stacked, as well as an area in which the display panel 713 and the polarizing plate 712 overlap. An area in which the pad part 730 exist, may be maintained widely, and thus wires 715 extending from the active area 720 may be disposed in a sufficient area. The pad part 730, in which the wires are disposed, may be wide. However, according to an embodiment, the polarizing plate 712 may be disposed, on the display panel 713, more inward than a boundary of the display panel 713 in consideration of an attachment tolerance (dt). When the display panel 713 is cut along a cut path 714, the display panel may include a reverse stepped portion 745. The reverse stepped portion 745 is disposed at both sides of a filler member 740, and thus a protective layer may additionally be applied to remove the reverse stepped portion.

Referring to FIG. 7B, a cross section view taken along line B-B' in FIG. 7A is illustrated. According to an embodiment, a reverse stepped portion between the display panel 713, and the polarizing plate 712 and an adhesive member 711 may occur. When the reverse stepped portion occurs, the filler member 740 may be disposed to remove the reverse stepped portion 745. However, even when the reverse stepped portion is removed by the filler member, a protective layer 750 may also cause inter-layer separations at interfaces with the protective layer. Therefore, it may be difficult to block the introduction of moisture completely.

Referring to FIGS. 8A and 8B, a case in which a display panel 813 is cut in a stepped shape and a filler member 840 is spaced apart from a bending area and an intersection point, is illustrated.

According to various embodiments, the display panel 813 may include an active area 820 and a pad part 830. The active area 820 may be an area including a pixel of the display panel 813 to emit light to the outside so as to transmit information, and the pad part 830 may be an area in which a wire connected to the active area 820 is disposed.

According to another embodiment, laser cutting may be performed along a first path 851 up to an area in which the display panel 813 and a polarizing plate 812 overlap, and additional cutting may be performed along a second path 852 around an area in which the filler member 840 is disposed, by adjusting the strength of a laser. The display panel 813 may be cut in a stepped shape in an area in which an intersection point 850 is disposed.

According to various embodiments, the display panel 813 and the polarizing plate 812 may be cut together along the first path 851, in order to prevent a reverse stepped portion 845 from being formed from the area in which the filler member 840 is disposed, to a curved area 890b. The first path 851 may be disposed in a part of the curved area 890b and a part of a flat area 890a, which is adjacent to the curved area 890b. According to an embodiment, the polarizing plate 812 may be disposed, on the display panel 813, more inward than a boundary of the display panel 813 in consideration of an attachment tolerance (dt). When the display panel 813 is cut along cut paths 851 and 852, a display module 800 may not include a reverse stepped portion. The display module 800 may not include a reverse stepped portion up to the area in which the filler member 840 is disposed, so that waterproof performance can be improved. According to various embodiments, the second path 852 may start from an inner portion of the flat area 890a with respect to the filler member 840. By the second path 852, an area in which the polarizing plate 812 is not included, is cut. Therefore, a laser condition for the second path may be configured to be different from that of the first path 851.

According to an embodiment, the display panel 813 may be cut in a stepped shape in order to prevent a reverse stepped portion from occurring on the display panel 813 in the curved area 890b with respect to the filler member 840. According to an embodiment, when the display panel 813 is cut in a stepped shape, the pad part 830 disposed around an edge of the active area 820 may have a stepped shape. In the pad part 830 having the stepped shape, distances from the active area 820 to a cut boundary 813a of the display panel 813 with respect to the filler member 840 may be different from each other.

According to an embodiment, a wire 815 connected to the active area 820 may be disposed in the pad part 830. By stepped cutting, a width of the pad part 830 disposed in a direction toward the curved area 890b with respect to the filler member 840 may be small. A width of the pad part 830 disposed in an inner portion of the flat area 890a with respect to the filler member 840 may be similar to that of the pad part 730 illustrated in FIG. 7A.

According to an embodiment, the number of wires 815 connected to the active area 820 in the pad part 830 disposed in the direction toward the curved area 890b with respect to the filler member 840 is small. Therefore, it is possible to implement a stepped design, in which a BM increases in a direction inward from the curved area 890b with respect to the filler member 840.

According to an embodiment, a boundary between the display panel 813 and the polarizing plate 812, which are positioned in a side of the curved area 890b with respect to the filler member 840, may coincide with the cut boundary 813a. The display panel 813 and the polarizing plate 812, which are positioned in the side of the curved area 890b, have been cut together by the first cut path 851. Therefore, even when the polarizing plate 812 is tilted, a reverse stepped portion may not occur.

According to an embodiment, a boundary between the display panel 813 and the polarizing plate 812, which are positioned in the area in which the filler member 840 is disposed, may coincide with the cut boundary 813a, and a reverse stepped portion may not occur at the boundary. Since a reverse stepped portion does not occur between the display panel 813 and the polarizing plate 812, the corresponding boundary is filled with the filler member 840, and waterproof performance can be ensured.

According to various embodiments, an area which is formed through cutting toward an inner portion of the flat area 890a from the area in which the filler member 840 is disposed, does not match a cut boundary surface of the display panel 813 and an edge of the polarizing plate 812, and may have a reverse stepped portion 845 formed therein. According to an embodiment, even when moisture is introduced from the curved area 890b, the filler member 840 may prevent the moisture from being introduced through the reverse stepped portion 845. When the reverse stepped portion 845 (e.g., the reverse stepped portion 745 in FIG. 7B) is formed, the reverse stepped portion may be removed by a protective layer (e.g., the protective layer 750 in FIG. 7B). However, the protective layer 750 may be separated from the polarizing plate 812 at a contact surface therebetween, thereby weakening a waterproof function. However, the filler member 840 may block moisture from entering a position where the reverse stepped portion 845 exists, thereby reducing a concern about the separation of the protective layer 750.

According to various embodiments, the filler member 840 may be combined with a first waterproof member (e.g., the first waterproof member 341 of FIG. 3A) and a second waterproof member (e.g., the second waterproof member 342 of FIG. 3A), to form a closed loop so as to seal an inner space.

Referring to FIG. 8B, a reverse stepped portion between the display panel 813, and the polarizing plate 812 and an adhesive member 811 may not occur. As described above, because a reverse stepped portion does not occur, there is no need to apply a protective layer separately, and moisture may be prevented from being introduced due to a separation at interfaces between the protective layer and each layer of the display panel 813. The transparent plate 810 and the polarizing plate 812 may be attached to each other by the adhesive member 811, and the adhesive member 811 may be an optical adhesive member (OCA).

According to various embodiments, a reverse stepped portion does not occur at a boundary surface between the display panel 813 and the polarizing plate 812, which are positioned from an area in which the filler member 840 is disposed, to the curved area 890b. Therefore, the display module can ensure waterproof performance even when exposed to moisture.

Figure 9:
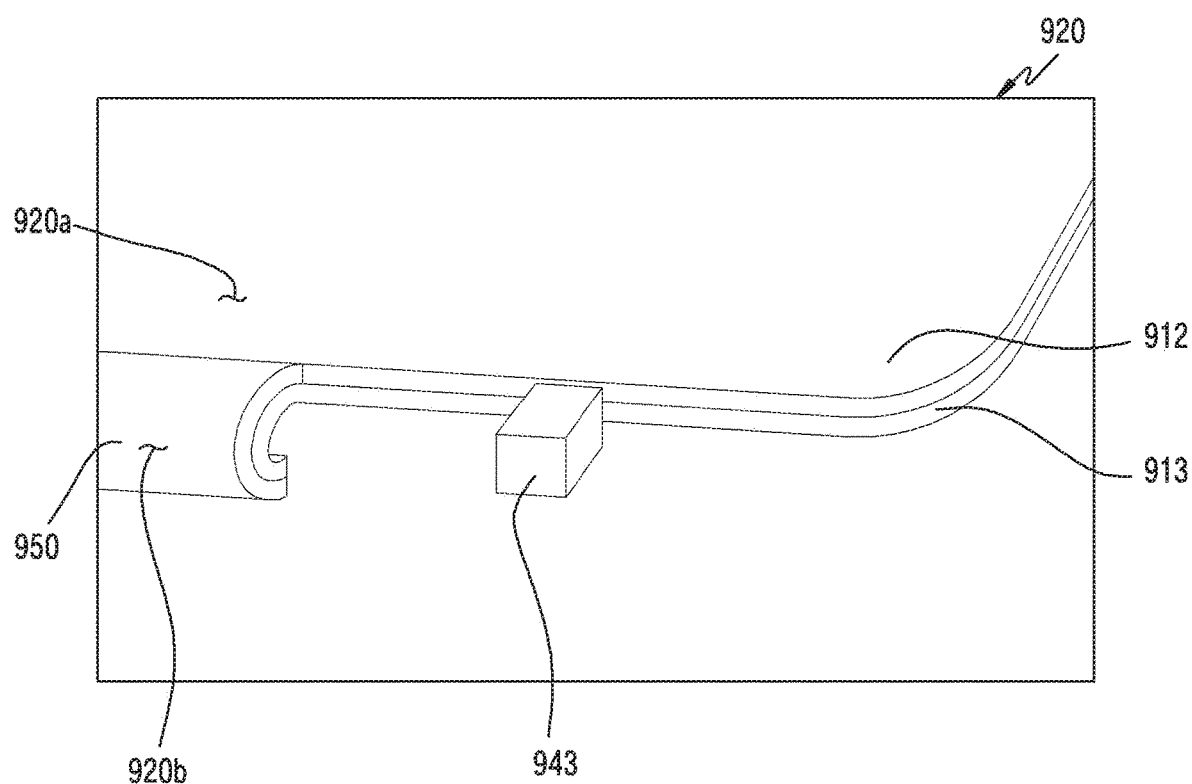
FIG. 9 is a perspective view of a display module according to an embodiment of the disclosure.

FIG. 9 is a perspective view of a display module according to an embodiment of the disclosure.

Referring to FIG. 9, a display module 920 may include a display panel 913 and a polarizing plate 912. The polarizing plate 912 may be disposed on a flat part 920a of the display panel 913, and a protective layer 950 may be disposed on a connection area 920b of the display panel 913. The connection area 920b may extend from a part of an edge of the flat part 920a. The connection area 920b may be flat in a portion extending from the flat part 920a and may be curved in a remaining portion. The protective layer 950 may be disposed to be adjacent to a part of an edge of the polarizing plate 912.

According to various embodiments, a filler member 943 may be disposed on parts of cut surfaces of the display panel 913 and the polarizing plate 912. A reverse stepped portion may occur between the protective layer 950 and cut surfaces of the display panel 913 and the polarizing plate 912, and between the filler member 943 and cut surfaces thereof, and remaining cut surfaces of the display panel 913 and the polarizing plate 912 may be formed through cutting to prevent occurrence of a reverse stepped portion.

According to various embodiments, a waterproof member attached to a rear surface of the display panel 913 and a waterproof member attached to a rear surface of a transparent member of an electronic device may be combined with the filler member 943 to form a closed loop, so as to waterproof an inner space. The display panel 913 and the polarizing plate 912, which are disposed outward from the filler member 943 and the waterproof members of the electronic device may have a structure having no a reverse stepped portion.

According to various embodiments, a danger that waterproof performance may be decreased by a separation of an interface with the protective layer 950, may be reduced by removing a reverse stepped portion between a part of the display panel 913 and a part of the polarizing plate 912, which are positioned in an area excluding an area which is waterproofed by the waterproof members and the filler member 943.

As described above, an electronic device (electronic device 300 in FIG. 3A) according to various embodiments may include: The electronic device may include: a housing including a first plate (e.g., transparent plate 310 in FIG. 3A) oriented in a first direction, a second plate oriented in a second direction opposite to the first direction, and a side surface member (e.g., side surface member 330 in FIG. 3A) surrounding a space between the first plate and the second plate; a display panel (e.g., display panel 613 in FIG. 6A) that includes a flat area (e.g., area 641 in FIG. 6A) including an active area configured to emit light toward the first plate, and a connection area (e.g., connection area 642 in FIG. 6A) extending from at least a partial area of one edge of the flat area and is disposed between the first plate and the second plate; a polarizing plate (e.g., polarizing layer 612 in FIG. 6A) disposed on the flat area; and a filler member (e.g., filler member 740 in FIG. 7A) spaced apart from the connection area and disposed on the one edge of the flat area, wherein the one edge of the flat area includes a cut surface bent in a stepped shape in an area on which the filler member is disposed, and a part of the cut surface includes a shape in which a boundary of the display panel coincides with a boundary of the polarizing plate.

According to various embodiments, the cut surface may include a first cut surface on which the boundary of the display panel coincides with the boundary of the polarizing plate, and a second cut surface on which the boundary of the display panel and the boundary of the polarizing plate form a reverse stepped portion, and the second cut surface may be disposed between the connection area and the filler member.

According to various embodiments, the electronic device may include: a first waterproof member (e.g., first waterproof member 341 in FIG. 3A) disposed between the first plate and the side surface member; and a second waterproof member (e.g., second waterproof member 342 in FIG. 3A) extending along an edge of a surface of the display panel, which is oriented toward the second plate.

According to various electronics, the filler member may be combined with the first waterproof member and the second waterproof member to seal the space.

According to various embodiments, the electronic device may further include a protective layer (e.g., protective layer 650 in FIG. 6A) disposed on the connection area.

According to various embodiments, the electronic device may further include a flexible printed circuit board (FPCB) (e.g., flexible printed circuit board 660 in FIG. 6A) connected to an end of the connection area.

According to various embodiments, the connection area may be bent with a predetermined curvature such that the flexible printed circuit board and a rear surface of the active area face each other.

According to various embodiments, the flexible printed circuit board and the active area may be electrically connected by various conductive patterns (e.g. wires 815 in FIG. 8A) disposed in the connection area.

According to various embodiments, the electronic device may further include a protective layer (e.g., protective layer 650 in FIG. 6A) applied to the connection area to protect the various conductive patterns.

According to various embodiments, the cut surface may include a first cut surface formed through cutting along a first path (e.g. first path 851 in FIG. 8A) extending along an edge of the polarizing plate and an edge of the flat area, and may be formed through cutting from one point of the first path along a second path (e.g., second path 852 in FIG. 8A) including the connection area.

According to various embodiments, an intersection point (e.g., intersection point 850 in FIG. 8A) between the first path and the second path may be spaced apart from the connection area.

According to various embodiments, the intersection point may be disposed around the filler member.

According to various embodiments, the connection area may be made of a polyimide material.

According to various embodiments, the protective layer may be applied to have a predetermined thickness on an area in which the connection area is bent.

A display module (e.g., display module 800 in FIG. 8A) according to various embodiments may include: a display panel (display panel 813 in FIG. 8A) including a flat area (e.g., area 641 in FIG. 6A) including an active area (e.g., active area 820 in FIG. 8A) configured to emit light, and a connection area (connection area 642 in FIG. 6A) extending from at least a partial area of one edge of the flat area; a display drive circuit disposed in the connection area; a polarizing plate (e.g., polarizing plate 830 in FIG. 8A) disposed on the flat area; a protective layer (element indicated by reference number 650 in FIG. 6A) disposed on the connection area; and a filler member (e.g., filler member 943 in FIG. 9) spaced apart from the connection area and disposed on the one edge of the flat area, wherein the one edge of the flat area, on which the filler member is disposed, includes a cut surface bent in a stepped shape, and a part of the cut surface includes a shape in which a boundary of the display panel coincides with a boundary of the polarizing plate.

According to various embodiments, the display module may further include: a flexible printed circuit board (FPCB) connected to an end of the connection area.

According to various embodiments, the connection area may be bent with a predetermined curvature such that the flexible printed circuit board and a rear surface of the active area face each other.

According to various embodiments, the flexible printed circuit board and the active area may be electrically connected by various conductive patterns disposed in the connection area.

According to various embodiments, the protective layer may be applied to protect the various conductive patterns.

According to various embodiments, the cut surface may be formed through cutting along a first path (e.g., first path 851 in FIG. 8A) extending along an edge of the polarizing plate and an edge of the active area, and through cutting from one point of the first path along a second path (e.g., second path 852 in FIG. 8A) extending along the protective layer and the connection area.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing including:
a first plate oriented in a first direction,
a second plate oriented in a second direction opposite to the first direction, and
a side surface member surrounding a space between the first plate and the second plate;
a display panel disposed between the first plate and the second plate, the display panel including:
a flat area comprising an active area configured to emit light toward the first plate, and
a connection area extending from at least a partial area of one edge of the flat area;
a polarizing plate disposed on the flat area; and
a filler member spaced apart from the connection area and disposed on the one edge of the flat area,
wherein the one edge of the flat area comprises a cut surface bent in a stepped shape in an area on which the filler member is disposed, and
wherein a part of the cut surface comprises a shape in which a boundary of the display panel coincides with a boundary of the polarizing plate.

2. The electronic device of claim 1,
wherein the cut surface comprises a first cut surface on which the boundary of the display panel coincides with the boundary of the polarizing plate, and a second cut surface on which the boundary of the display panel and the boundary of the polarizing plate form a reverse stepped portion, and
wherein the second cut surface is disposed between the connection area and the filler member.

3. The electronic device of claim 1, further comprising:
a first waterproof member disposed between the first plate and the side surface member; and
a second waterproof member extending along an edge of a surface of the display panel, which is oriented toward the second plate.

4. The electronic device of claim 3, wherein the filler member is combined with the first waterproof member and the second waterproof member to seal the space.

5. The electronic device of claim 1, further comprising:
a protective layer disposed on the connection area.

6. The electronic device of claim 5, wherein the protective layer is applied to have a predetermined thickness on an area in which the connection area is bent.

7. The electronic device of claim 1, further comprising:
a flexible printed circuit board (FPCB) connected to an end of the connection area.

8. The electronic device of claim 7, wherein the connection area is bent with a predetermined curvature such that the flexible printed circuit board and a rear surface of the active area face each other.

9. The electronic device of claim 8, wherein the flexible printed circuit board and the active area are electrically connected by various conductive patterns disposed in the connection area.

10. The electronic device of claim 9, further comprising:
a protective layer applied to the connection area to protect the various conductive patterns.

11. The electronic device of claim 1, wherein the cut surface comprises a first cut surface formed by cutting:
along a first path extending along an edge of the polarizing plate and an edge of the flat area, and
from one point of the first path along a second path including the connection area.

12. The electronic device of claim 11, wherein an intersection point between the first path and the second path is spaced apart from the connection area.

13. The electronic device of claim 12, wherein the intersection point is disposed around the filler member.

14. The electronic device of claim 1, wherein the connection area comprises a polyimide material.

15. A display module comprising:
- a display panel including:
    - a flat area comprising an active area configured to emit light, and
    - a connection area extending from at least a partial area of one edge of the flat area;
- a display drive circuit disposed in the connection area;
- a polarizing plate disposed on the flat area;
- a protective layer disposed on the connection area; and
- a filler member spaced apart from the connection area and disposed on the one edge of the flat area,
- wherein the one edge of the flat area, on which the filler member is disposed, comprises a cut surface bent in a stepped shape, and
- wherein a part of the cut surface comprises a shape in which a boundary of the display panel coincides with a boundary of the polarizing plate.

16. The display module of claim 15, further comprising:
- a flexible printed circuit board (FPCB) connected to an end of the connection area.

17. The display module of claim 16, wherein the connection area is bent with a predetermined curvature such that the flexible printed circuit board and a rear surface of the active area face each other.

18. The display module of claim 17, wherein the flexible printed circuit board and the active area are electrically connected by various conductive patterns disposed in the connection area.

19. The display module of claim 18, wherein the protective layer is applied to protect the various conductive patterns.

20. The display module of claim 15, wherein the cut surface is formed by cutting:
- along a first path extending along an edge of the polarizing plate and an edge of the active area, and
- from one point of the first path along a second path extending along the protective layer and the connection area.

* * * * *